United States Patent [19]

Makiuchi et al.

[11] Patent Number: 5,436,997
[45] Date of Patent: Jul. 25, 1995

[54] OPTICAL FIBER-OPTICAL DEVICE COUPLING PACKAGE AND OPTICAL FIBER-OPTICAL DEVICE MODULE

[75] Inventors: Masao Makiuchi; Gohji Nakagawa, both of Kawasaki, Japan

[73] Assignee: Fujitsu Limited, Kawasaki, Japan

[21] Appl. No.: 135,443

[22] Filed: Oct. 13, 1993

[30] Foreign Application Priority Data

Oct. 14, 1992 [JP] Japan .................. 4-275823
Oct. 4, 1993 [JP] Japan .................. 5-247757

[51] Int. Cl.6 ............................ G02B 6/26; G02B 6/12
[52] U.S. Cl. ........................................ 385/92; 385/14; 385/15; 385/88; 385/89; 385/94
[58] Field of Search .................... 385/14, 15, 76, 77, 385/78, 88, 89, 92, 94

[56] References Cited

U.S. PATENT DOCUMENTS

| | | | |
|---|---|---|---|
| 4,730,198 | 3/1988 | Brown et al. | 385/49 X |
| 4,744,626 | 5/1988 | Mery | 385/92 X |
| 4,763,225 | 8/1988 | Frenkel et al. | 361/388 |
| 4,865,410 | 9/1989 | Estrada et al. | 385/92 X |
| 4,911,519 | 3/1990 | Burton et al. | 385/92 X |
| 4,979,787 | 12/1990 | Lichtenberger | 385/92 X |
| 5,005,939 | 4/1991 | Arvanitakis | 385/92 X |
| 5,011,246 | 4/1991 | Corradetti et al. | 385/92 X |
| 5,155,786 | 10/1992 | Ecker et al. | 385/94 |
| 5,202,943 | 4/1993 | Carden et al. | 385/92 |
| 5,216,737 | 6/1993 | Driessen et al. | 385/93 |
| 5,291,572 | 3/1994 | Blonder et al. | 385/94 |
| 5,295,214 | 3/1994 | Card et al. | 385/92 |
| 5,329,604 | 7/1994 | Baldwin et al. | 385/92 |
| 5,337,396 | 8/1994 | Chen et al. | 385/92 |

FOREIGN PATENT DOCUMENTS

| | | | |
|---|---|---|---|
| 0158561 | 10/1985 | European Pat. Off. | 385/92 X |
| 0213426 | 3/1987 | European Pat. Off. | 385/92 X |
| 63-18308 | 1/1988 | Japan | 385/92 X |

OTHER PUBLICATIONS

T. Kato et al., IEEE Proc. 42nd Electronic Components and Technology Conference, pp. 853–860. (1992) (no month of publication available).
Yusuke Ota and Robert G. Swartze, IEEE The Magazine of Lightwave Telecommunication Systems, vol. 2, No. 2, pp. 24–32, May, 1991.
Patent Abstracts of Japan, vol. 8, No. 127 (E-250) (1564). Jun. 14, 1984.

*Primary Examiner*—Brian Healy
*Attorney, Agent, or Firm*—Staas & Halsey

[57] ABSTRACT

A package used to couple an optical fiber and an optical device to each other comprises a frame member open at the top and the bottom thereof for accommodating an electronic part therein, the frame member having an opening formed in a portion of a side wall thereof in or adjacent which an optical fiber and an optical device are coupled to each other, a heat sink for closing one of the opening ends of the frame member, and a lid for closing the other opening end of the frame member.

25 Claims, 13 Drawing Sheets

OPTICAL FIBER-OPTICAL DEVICE COUPLING PACKAGE AND OPTICAL FIBER-OPTICAL DEVICE MODULE

BACKGROUND OF THE INVENTION

1. Field of the Invention

This invention relates to a package for coupling an optical fiber and an optical device and an optical fiber-optical device module, and more particularly to a package for coupling an optical fiber and a light emitting element or an optical fiber and a photodetector and an optical fiber-optical device module accommodated in and integrated with such package.

2. Description of the Related Art

A module including an optical fiber and an optical device converts an electric signal in transmission into an optical signal or converts an optical signal into an electric signal.

Modules of the type mentioned allow transmission of parallel signals between different electronic systems or between different circuit boards in an electronic system, and accordingly, the characteristics of electronic system are improved in terms of noise, crosstalk or transmission rate.

Where signals are transmitted between a plurality of electronic computers or signals are transmitted between different circuit boards in an electronic computer, the rate of signal processing in such electronic computer or computers can be raised by converting an optical signal into an electric signal and converting an electric signal into an optical signal.

In order to couple an optical fiber and an optical device to each other, it is required to develop a package of a small size with which such coupling can be performed readily. In this instance, a package for an optoelectronic coupling module is used to couple an optical fiber and optical devices such as a semiconductor laser or a light emitting diode or to couple an optical fiber and a light detecting element such as a PIN-photodiode. It is to be noted that a light emitting element, a photodetector, an optical waveguide modulator and other like elements are generally referred to each as an optical device herein.

A package having such a structure as shown, for example, in FIGS. 1(a) and 1(b) has been proposed as a package of the type described above. The package is disclosed in [1] T. Karo et al., IEEE Proc. 42nd Electronic Components and Technology Conference pp. 853–860, 1992.

Referring to FIGS. 1(a) and 1(b), a photodiode 101 serving as a light detecting element is placed on the bottom of a package body 100 which is open at the top thereof, and a optical fiber 102 extends through a side wall of the package body 100 and the extreme end of the optical fiber 102 faces to a light receiving portion of the photodiode 101. The package body 100 is closed at the top thereof with a lid 103. The photodiode 101 and the optical fiber 102 are fixed in an opposing relationship to each other on a support table 104. Upon positioning, one of the photodiode 101 and the optical fiber 102 is fixed, and in this condition, the other is positioned relative to the one using a jig.

With the package of the structure described above, in addition to a space required to mount the photodiode 101 and the optical fiber 102, spaces S for accepting such jig must be assured, which makes an obstacle to minimization of the package.

Besides, since the photodiode 101 and the optical fiber 102 are supported only from the bottom of the package, in such a condition that a plurality of such combinations are arranged in parallel to each other as shown FIG. 1(a), then torsion is likely caused between the photodiodes 101 and the optical fibers 102 by deformation of the bottom of the package or the support table 104 arising from thermal expansion so that optical axes of the photodiodes 101 and the optical fibers 102 are put out of alignment with each other. Such disalignment is remarkable where a multi-channel optical device and multichannel optical fiber are coupled to each other.

It has been proposed in the following documents to attach an optical device to an end of an optical fiber array in order to prevent such disalignment as described above. However, neither of the documents discloses a structure of a package for accommodating them in an airtight condition. See, for example, [2] U.S. Pat. No. 4,730,198 and [3] Yusuke Ota, Robert G. Swartz, IEEE The Magazine of Lightwave Telecommunication Systems, Vol.2, No. 2, pp. 24–32, May 1991

Another structure has been proposed and is shown in FIG. 2 wherein optical fibers 107 and optical devices 108 are coupled to each other and an electronic part 106 such as an LSI is accommodated in a package 105. The package 105 has a bottomed structure with the top opened, and a space which is required to mount the optical fibers 107 and the optical devices 108 is assured around the electronic part 106 and the optical devices 108. The module of the type just described is disclosed, for example, in [4] Japanese Patent Laid-Open Application No. Sho. 63-18308.

SUMMARY OF THE INVENTION

It is an object of the present invention to provide an optical fiber-optical device coupling package and an optical fiber-optical device module wherein the space required to couple an optical fiber and an optical device to each other is small and disalignment of the optical fiber and the optical device caused by thermal expansion is minimized.

In accordance with the present invention, there are provided an optical fiber-optical device coupling package and an optical fiber-optical device module, comprising a frame open at the top and the bottom thereof for accommodating an electronic part therein, said frame having an opening formed in a portion of a side wall thereof in or adjacent which an optical fiber and an optical device are coupled to each other, and first and second lids for closing the top and the bottom of said frame, respectively. The first or second lid is formed as a heat sink.

In the package, a space of an electronic part accommodating chamber in the electronic member is applied as a space for accepting therein a jig which is used to couple the optical fiber and the optical device to each other, and besides the space is open at the top and the bottom thereof. Consequently, the jig for mounting an optical device can be inserted into the space both from above and from below, and accordingly, the operability in such coupling is enhanced. Further, if the coupled end of the optical fiber is supported by means of a connector or a ferule, mounting of the optical fiber can be performed from outside the frame, and consequently, the operation is facilitated.

Further, since the space required to couple the optical fiber and the optical device to each other may be only the opening in the side wall, the space necessary for optical coupling is reduced remarkably. If the optical device is attached to an end face of a ferule for an optical fiber to couple the optical fiber and the optical device to each other and then inserted into the opening in the side wall of the frame, then the operation for coupling between the optical device and the optical fiber is further reduced, and besides, the members are enclosed in an airtight condition in the package. Further, since the optical fiber and the optical device are secured to the side wall of the frame, even if the electronic part in the frame operates so that the frame is deformed by thermal expansion of the same, the deformation of the side wall around the opening is very little comparing with the deformation of the entire frame and does not have such an influence as to cause disalignment of the optical axes of the optical fiber and the optical device. Further, even if the thickness of the frame is increased by thermal expansion of the same so that the distance between the extreme end of the optical fiber and the optical device is increased, such increase does not make an obstacle to transmission of an optical signal.

Where the frame is closed at the top or the bottom thereof with the heat sink (or lid) and the electronic part and the heat sink are disposed in contact with each other, the electronic part is cooled by the heat sink so that the thermal expansion of the frame is restricted. If a material having a low thermal conductivity is interposed between the frame and the heat sink, the thermal expansion of the frame is further reduced, and heat produced at the coupling portions of the optical device and the optical fiber is cooled by way of the frame, not by the heat sink.

Where a partition is provided in the inside of the frame so that a plurality of electronic parts may be accommodated in the frame, the electronic parts can be electrically isolated readily from each other. Where a lead for connection of a terminal of the electronic part is formed along an inner wall of the frame in such a manner as to extend to the outside of the frame in order to electrically lead out the terminal of the electronic part to the outside, there is no necessity of providing a space into which a jig is to be accepted to establish electric connection of the electronic part, and consequently, the optical fiber-optical device coupling package and the optical fiber-optical device module can be formed in a very small size. Where an electrode lead connected to the optical device has a microstrip line structure, otherwise possible crosstalk between different optical device channels is eliminated. Further, since use of bonding wires is restricted to the minimum and patterned wiring lines are used, also skew is minimized.

DESCRIPTION OF THE PREFERRED EMBODIMENTS

First Embodiment

Figure 1A:
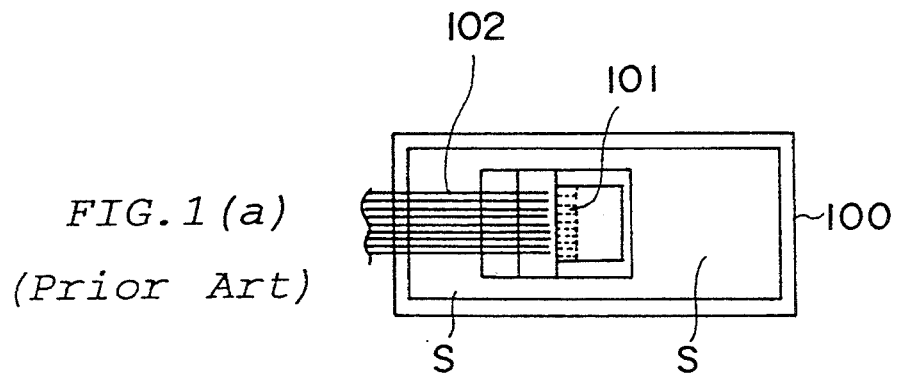
FIGS. 1(a) and 1(b) are a plan view and a side elevational sectional view, respectively, showing a first example of conventional optical fiber-optical device module.
Figure 1B:
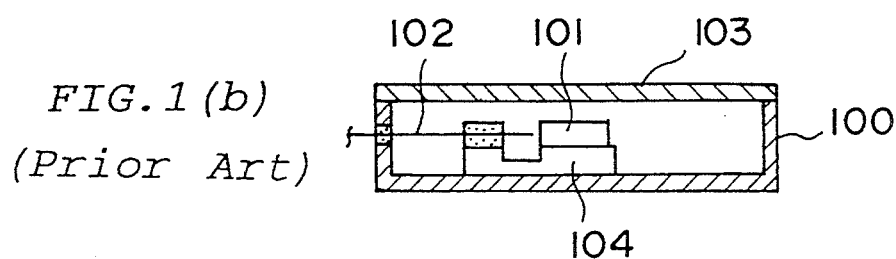
Figure 2:
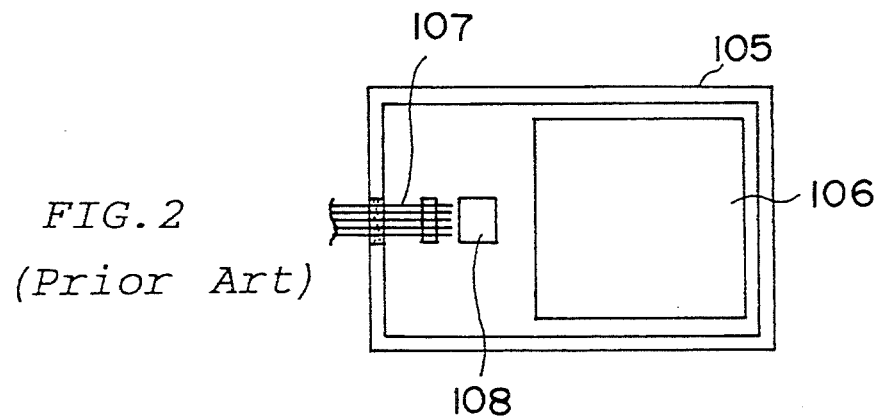
FIG. 2 is a plan view showing a second example of conventional optical fiber-optical device module in which an electronic part is accommodated.

A first embodiment of the present invention will be described with reference to FIGS. 3, 4, 5(a) and 5(b), and 6(a) and 6(b).

An optical fiber-optical device module of the present embodiment includes an electronic part 9, accommodated in a package formed from a frame 1, a heat sink 8 and a rear lid 10, and a plurality of optical fibers 6 and a plurality of photodetectors 4 are paired with and coupled to each other and accommodated in each of a pair of openings 3 formed in the frame 2.

Figure 6A:
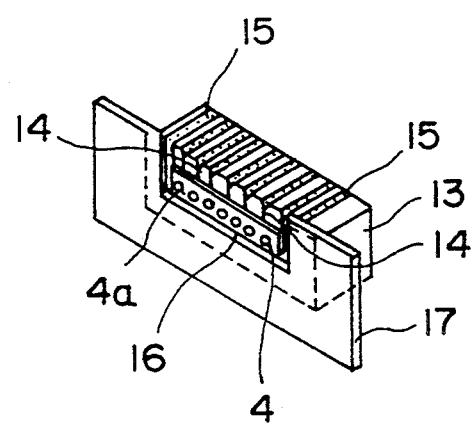
FIG. 6(a) is a perspective view showing an optical device employed in the optical fiber-optical device module of FIG. 3.
Figure 6B:
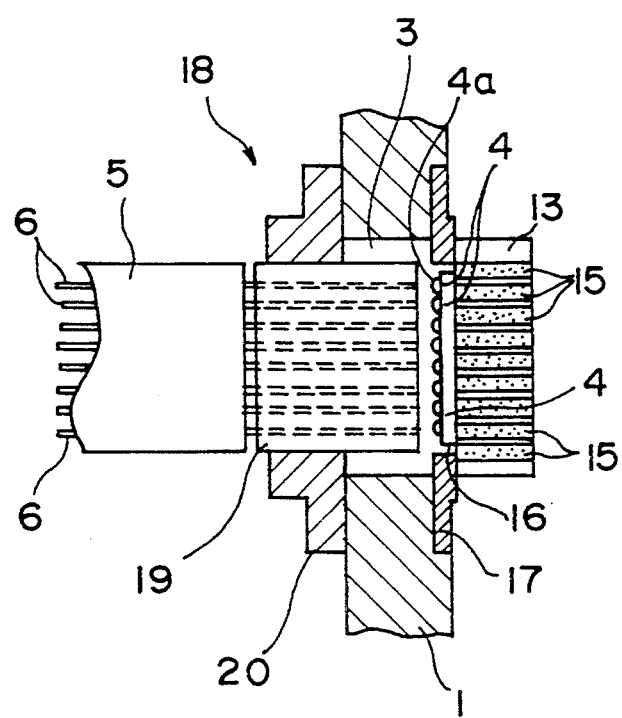
FIG. 6(b) is a plan view illustrating a coupled condition between an optical fiber and an optical device in the optical fiber-optical device module of FIG. 3.

The frame 1 is open at the top and the bottom thereof, and the inside of the frame 1 serves as an electronic part accommodating chamber 2. The thickness of side walls of the frame 1 ranges from 1.5 to 2.5 mm or so, and the openings 3 each having four escape holes 3a at the four corners thereof are formed to extend perpendicularly through one of the side walls of the frame 1. At a portion of each of the openings 3 adjacent the electronic part accommodating chamber 2, such photodetectors 4 as shown in FIG. 6(a) are mounted adjacent a support base plate 13, and at the opposite portion of each of the openings 3, such optical fibers 6 covered with a multi-channel ribbon 5 of vinyl as shown in FIG. 6(b) are provided at the pitch of, for example, 250 μm. Light receiving faces of the photodetectors 4 and extreme ends of the optical fibers 6 are disposed in an opposing relationship in the openings 3.

Figure 3:
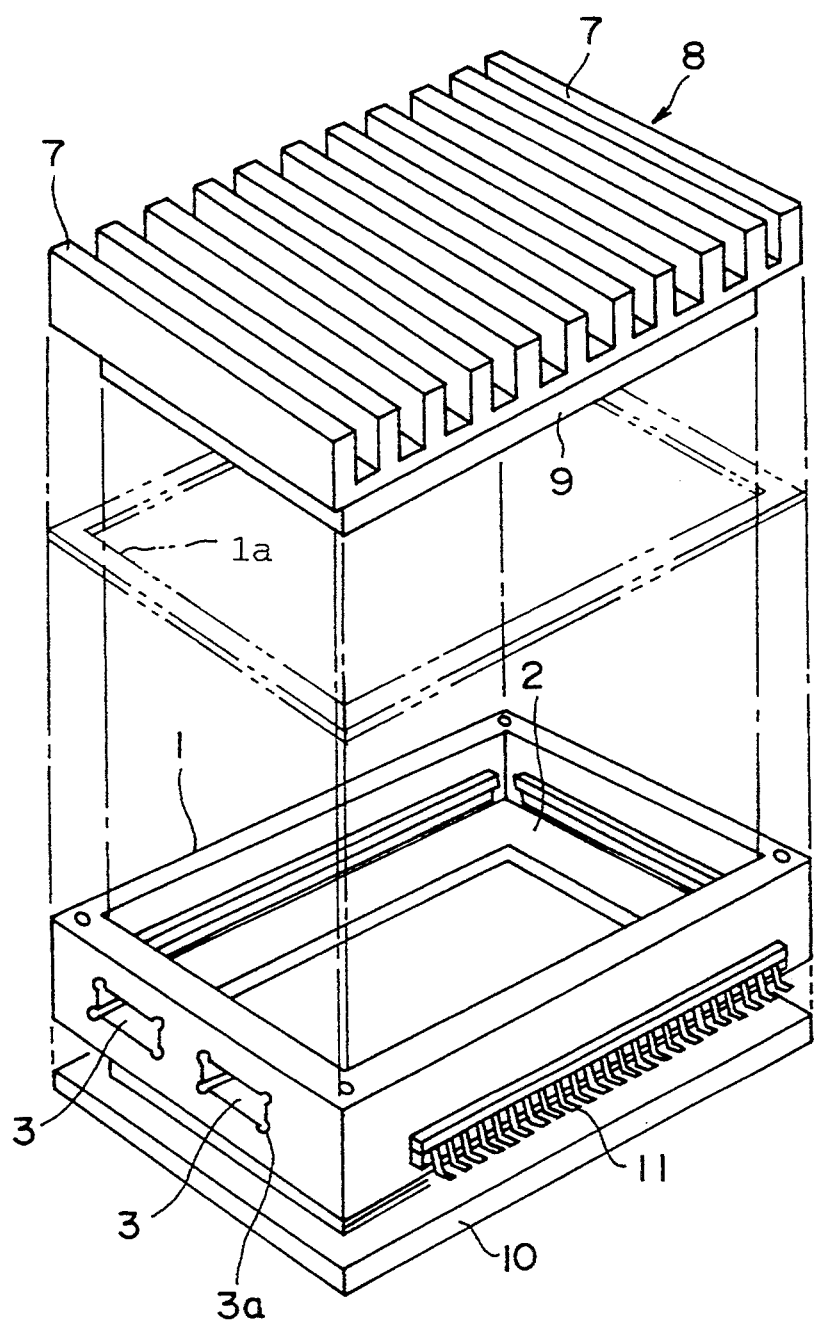
FIG. 3 is an exploded perspective view of an optical fiber-optical device module of a first embodiment of the present invention as viewed from the side of a heat sink.

A heat sink 8 is fitted at one of the top and bottom openings of the frame 1 and has a plurality of fins 7 formed on an outer face thereof as shown in FIG. 3. The electronic part 9 is mounted on the opposite face of the heat sink 8 adjacent the frame 1 such that it is accommodated in the electronic part accommodating chamber 2 when the heat sink 8 is mounted in position on the frame 1. The electronic part 9 may be, for example, a semiconductor integrated circuit device (LSI). The other opening of the frame 1 remote from the heat sink 8 is closed with the rear lid 10.

A plurality of electrode leads 11 are held in each of support plates 12 made of a ceramic material such as alumina and are arranged in parallel to each other. The support plates 12 are mounted on and extend through the other side walls of the frame 1 than the side wall in which the openings 3 are formed. Each of the electrode leads 11 is bent substantially like a step and extends, at an end portion thereof, outwardly from a lower face of the frame 1 adjacent the rear lid 10. The other ends of the electrode leads 11 are exposed from above the support plates 12 extending inwardly of the electronic part accommodating chamber 2, and the thus exposed portions are connected to conductive pads 9a of the electronic part 9, for example, by wire bonding.

Referring to FIG. 6(a), the photodetectors 4 in a array chip are arranged in parallel to each other at the distance of, for example, 250 μm and formed as a unitary member. A microlens 4a is integrated on the light receiving face of each of the photodetectors 4, and the photodetectors 4 are mounted on a support base plate 13.

A wiring pattern 14 for connecting the photodetectors 4 by flip chip bonding is formed on an upper face of the support base plate 13. The wiring pattern 14 is connected to electrode leads 15 embedded in recessed portions at a face portion of the support base plate 13.

The support base plate 13 is secured to a support frame 17, which is constituted from a plate having a recessed window formed by cutting the same adjacent the electrode leads 15 and exposing the microlenses 4a of the photodetectors 4 therethrough.

Figure 5A:
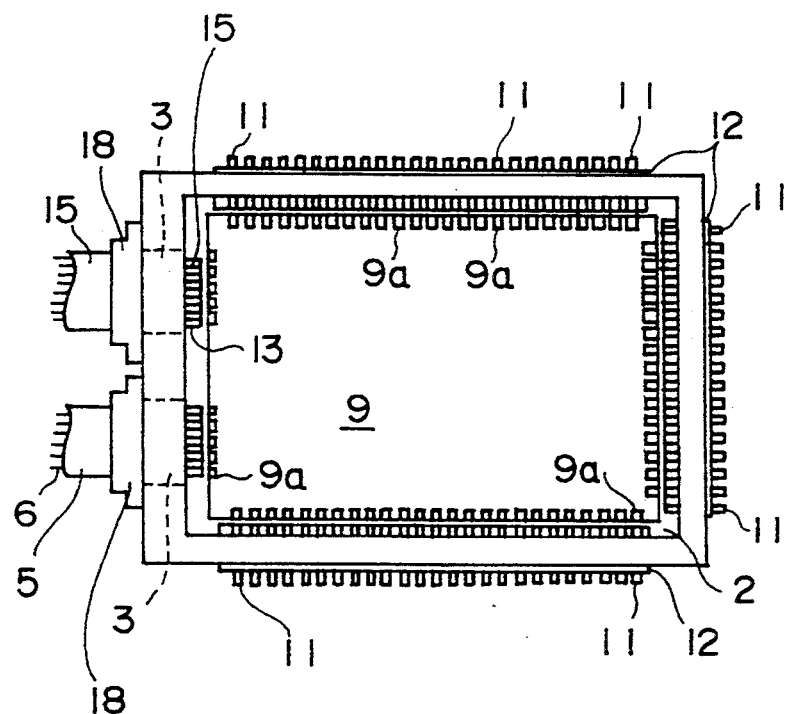
FIG. 5(a) is a plan view showing the optical fiber-optical device module of FIG. 3 with the lid removed.
Figure 5B:
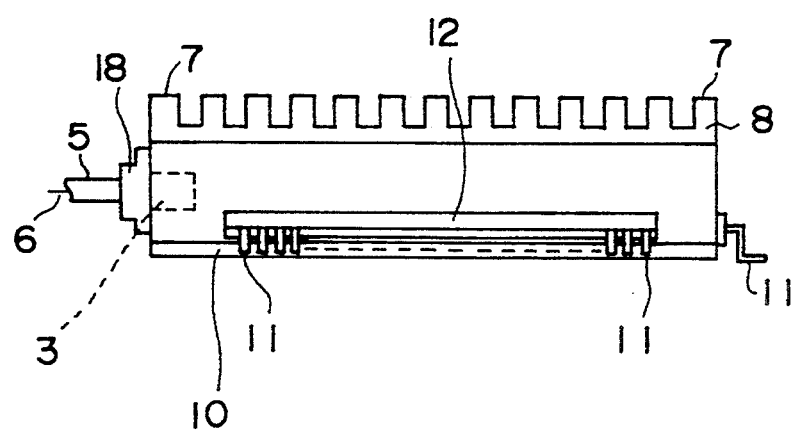
FIG. 5(b) is a side elevational view of the optical fiber-optical device module.

The support frame 17 is secured to the frame 1 such that the light receiving faces of the photodetectors 4 are directed toward the inside of the opening 3 of the frame 1 and the electrode leads 15 of the support base plate 13 are opposed to the rear lid 10. The support frame 17 is secured to the frame 1 by means of a YAG laser or a bonding agent in accordance with a material of the frame 1, and the electrode leads 15 of the support base plate 13 are connected by wire bonding or like means to the pads 9a of the electronic part 9 disposed in such a manner as shown in FIG. 5(a).

The optical fibers 6 are mounted such that, as shown in FIG. 6(b), end portions thereof exposed from the ribbon 5 are attached to a connector 18 with the extreme ends thereof directed toward the microlenses 4a of the photodetectors 4. The connector 18 has a structure wherein a block 19 in which the optical fibers 6 are held is supported on a cap 20, and in order to secure the connector 18 to the frame 1, a YAG laser, a bonding agent or some other means is used in accordance with a material of the frame 1.

It is to be noted that, if the photodetectors 4, the optical fibers 6 and the electronic part 9 are mounted into and bonded to the frame 1 by wire bonding and then the heat sink 7 is fitted into the frame 1 using metal welding, a bonding agent, a rubber packing or some other suitable means, whereafter the rear lid 10 is fixed to the bottom of the frame 1 by, for example, seam welding so as to establish an airtight condition, then an optical transmission coupling apparatus is completed.

It is to be noted that the frame 1, the support frame 17 for optical devices and so forth may be made of such suitable materials as a ceramic material, a metal or the like taking the materials of the optical devices, the connector 18 for optical fibers and so forth, the securing method of them and so forth into consideration.

With the package of the structure described above, since the optical fibers 6 and the photodetectors 4 are coupled to each other in each of the openings 3 in the side wall of the frame 1, the space necessary for connection between them is a projected portion of the support base plate 13 on which the photodetectors 4 are mounted, and consequently, the space necessary for optical coupling is reduced remarkably.

Besides, the space for accepting a jig which is used upon mounting of the photodetectors 4 may be the space of the electronic part accommodating chamber 2 in the frame 1. Moreover, since the frame 1 is open at the bottom thereof, a jig for mounting a photodetector can be inserted from above or below, and consequently, the operability is enhanced. Meanwhile, since the optical fibers 6 can be mounted from the outside of the frame 1, the operation is facilitated.

Positioning for connection between the photodetectors 4 and the optical fibers 6 is performed while light is irradiated from the optical fibers 6 and received by the photodetectors 4.

Further, since the optical fibers 6 and the optical devices 4 are secured to the end portion of the frame 1, even if the electronic part in the frame 1 operates so that the frame 1 is deformed by thermal expansion, the deformation of the side wall around the openings 3 is so small comparing with the deformation of the entire frame 1 that it will have no such influence as to cause disalignment of optical axis of the optical fibers 6 and the photodetectors 4. Further, even if the thickness of the frames 1 is increased a little by thermal expansion of it to expand the distances between the extreme ends of the optical fibers 6 and the optical devices 4, the amount of such expansion is so small that it does not make an obstacle to transmission of an optical signal. Further, heat produced at such optical coupling portions is radiated from the frame 1, and consequently, the cooling efficiency is high.

Besides, since the optical fibers 6 and the photodetectors 4 are supported in the openings 3 of the frame 1, the mechanical strength is high. Further, if conductive films are formed on the rear faces of the electrode leads 11 and 15 described above, a microstrip line structure is established, and consequently, crosstalk or skew is not caused readily between different optical device channels.

It is to be noted that, while photodetectors are used in the embodiment described above, light emitting elements such as semiconductor lasers or light emitting diodes may be adapted instead, or semiconductor optical modulation elements or some other optical devices may be employed. Where light emitting elements are used, they are first inserted, for example, by a small amount into an opening 3 and secured to the side wall of the frame 1, and then optical fibers are adjusted in position while the light emitting elements are energized.

Further, while the heat sink 8 in the embodiment described above contacts directly with the frame 1, if such a heat insulating member 1a as shown in FIG. 3 is held between the heat sink 8 and the frame 1, then heat of the electronic part 9 is radiated from the heat sink 8 while heat of the coupling portions between the optical fibers 6 and the optical devices 4 is radiated from the frame 1 separately from the heat sink 8, and consequently, the thermal expansion of the optical coupling portions in the openings 3 can be restricted low.

Second Embodiment

Figure 7A:
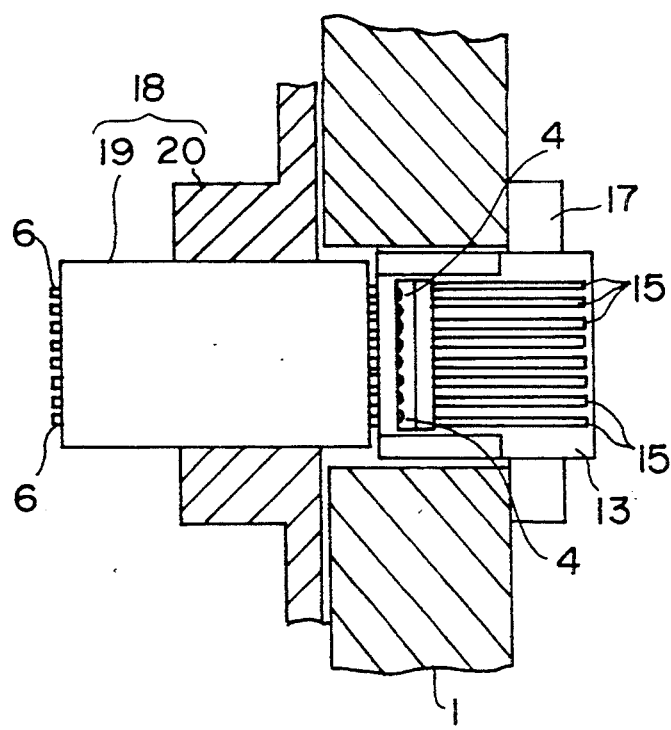
FIG. 7(a) is a plan view illustrating a coupled condition between an optical fiber and an optical device according to a second embodiment of the present invention.
Figure 7B:
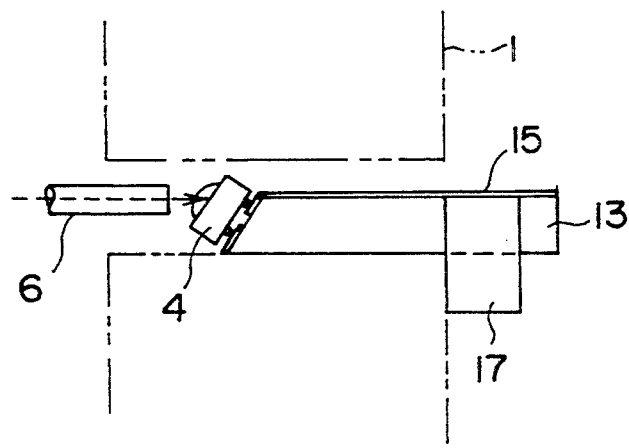
FIG. 7(b) is a side elevational view illustrating the coupled condition.

While, in the embodiment described above, the light receiving sides of the optical devices are inserted by a small amount in the openings 3 as seen in FIG. 6(b), the support base plates 13 for optical devices may be formed longer in the direction of the optical axes so that the optical devices 4 may be inserted in the openings 3 as seen in FIGS. 7(a) and 7(b).

In this instance, the faces on which the photodetectors 4 are mounted may be inclined obliquely a little as shown in FIG. 7(b), and even with such structure, no trouble occurs if the extreme ends of the photodetectors 4 are located in the proximity of the microlenses 4a.

Third Embodiment

Figure 8A:
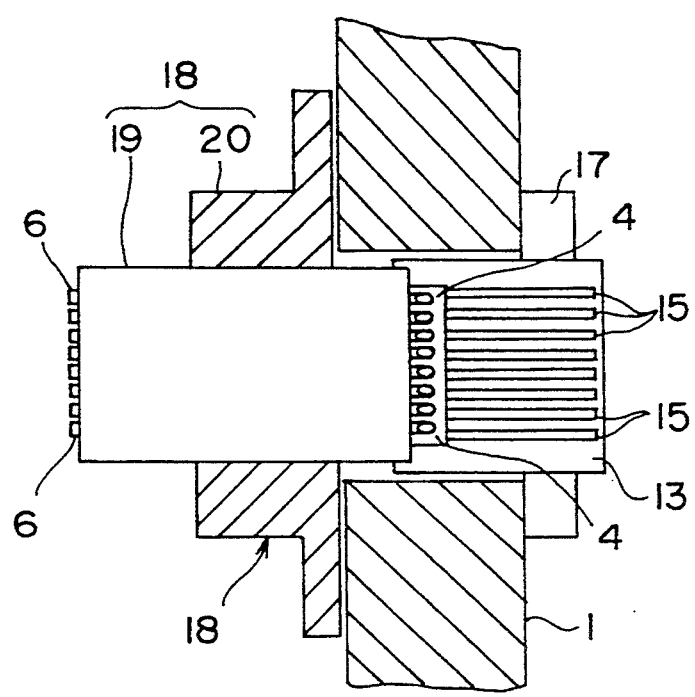
FIG. 8(a) is a plan view illustrating a coupled condition between an optical fiber and an optical device according to a third embodiment of the present invention.
Figure 8B:
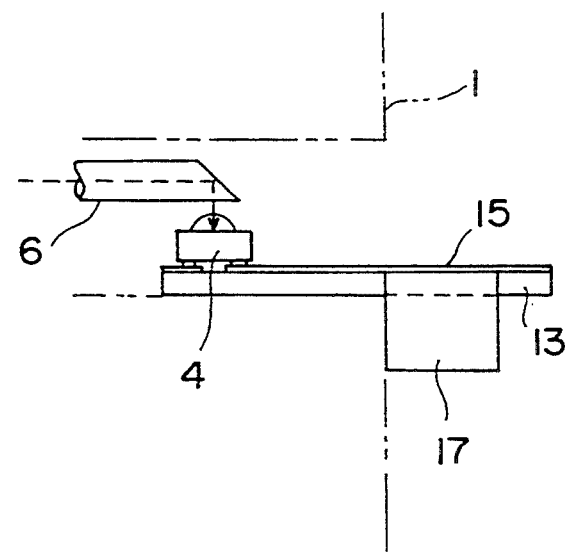
FIG. 8(b) is a side elevational view illustrating the coupled condition.

While, in the embodiments described above, the extreme ends of the optical fibers 6 are cut perpendicularly so that the photodetectors 4 may be disposed in an opposing relationship to the extreme ends of the optical fibers 6 in the openings 3, the extreme ends of the optical fibers 6 may otherwise be cut obliquely as shown in a third embodiment of FIGS. 8(a) and 8(b).

In this instance, the photodetectors 4 are placed on and connected to the electrode leads 15 of the support base plate 13 such that the light receiving faces 4a thereof may be directed in a perpendicular direction to the direction in which the openings 3 extend through the side wall of the frame 1. The electrode leads 15 are disposed at such positions that they face the rear lid 10 shown in FIGS. 3 and 4. Meanwhile, the support frame 17 for securing the support base plate 13 to the frame 1 is secured to face portions of the electrode leads 15 and the support base plate 13 on the rear side of the electrode leads 15.

The cut faces of the optical fibers 6 may be used as reflecting mirrors so that reflected light from them may be irradiated upon the photodetectors 4.

Fourth Embodiment

Figure 9:
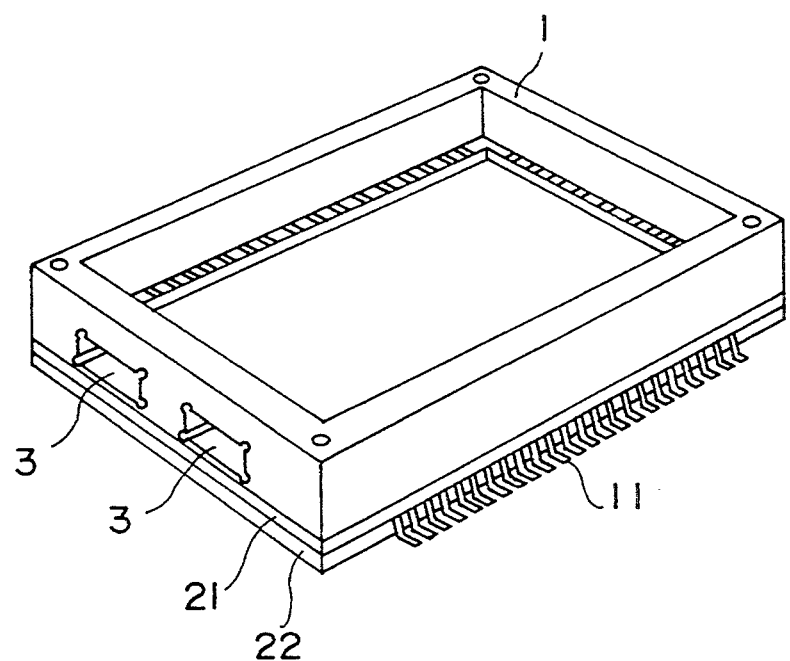
FIG. 9(a) is a perspective view showing an optical fiber and optical device package of a fourth embodiment of the present invention.
FIG. 9(b) is a side elevational view of the optical fiber and optical device package.
Figure 9:
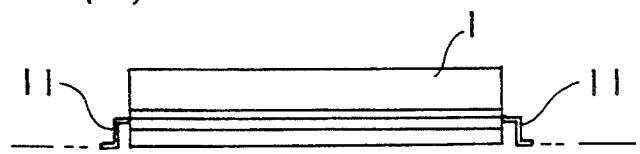

While, in the embodiments described above, the plurality of leads 11 are held in the support plates 12 and extend through the side wall of the frame 1, they may otherwise be disposed in such a manner as shown in FIGS. 9(a) and 9(b) that lead support layers 21 and 22 are placed below the frame 1 while the leads 11 bent in a step-like configuration extend inwardly and outwardly from between the lead support layers 21 and 22. In this instance, the lead support layer 21 disposed adjacent the rear lid 10 do not extend into the inside of the frame 1, and end portions of the leads 11 on the other lead support layer 22 are exposed to the rear lid 10 side.

Figure 10:
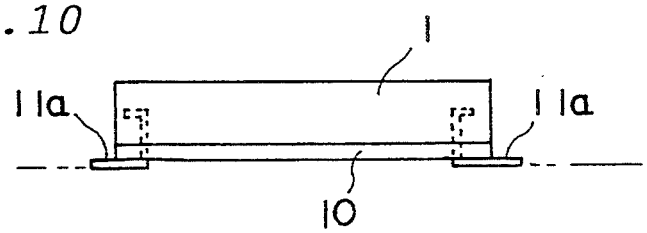
FIG. 10 is a side elevational view showing a package of another form of the fourth embodiment of the present invention.

Or, such a structure as shown in FIG. 10 may be employed wherein the leads 11 are bent in the inside of the frame 1 and extend through the rear led 10 while outer end portions thereof extend outwardly from the rear lid 10.

Fifth Embodiment

Figure 11:
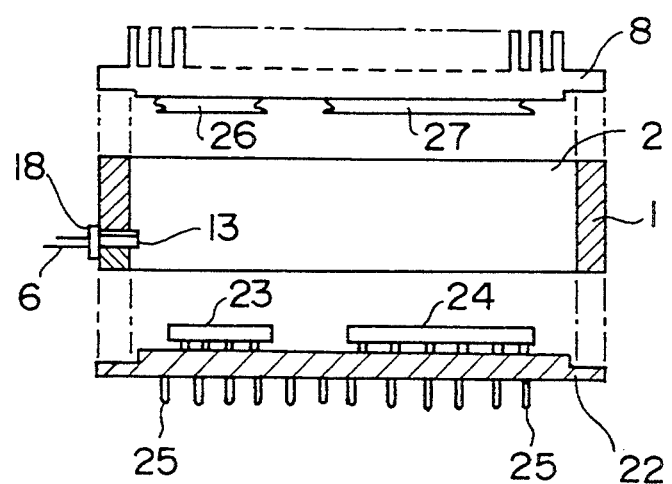
FIG. 11 is a sectional view showing an optical fiber-optical device module of a fifth embodiment of the present invention in a disassembled condition.

While, in the embodiments described above, the electronic part 9 is mounted on the heat sink 8, alternatively, as shown in FIG. 11, a plurality of electronic parts 23 and 24 may be bonded by flip-chip bonding to a wiring pattern (not shown) formed on a face of a rear lid 22 adjacent the frame 1.

In this instance, lead pins 25 extend from a lower face of the rear lid 22 to allow electric connection to an external apparatus. Further, pads 26 and 27 of a high conductivity for transmitting heat from the electronic parts 23 and 24 are provided on the face of the heat sink 8 adjacent the frame 1 and are held in contact with the electronic parts 23 and 24 to cool them.

Sixth Embodiment

While, in the first embodiment described above, the bonding pads 9a of the electronic part 9 mounted on the heat sink 8 and the inner ends of the leads 11 are connected to each other by wire bonding, some other connection structure may alternatively be employed.

Figure 12:
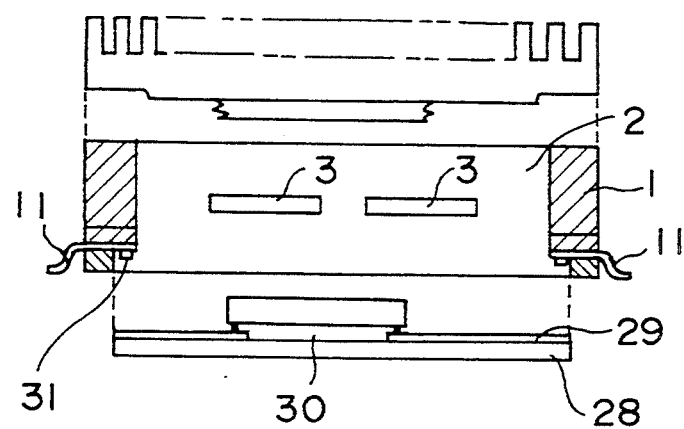
FIG. 12 is a sectional view showing an optical fiber-optical device module of a sixth embodiment of the present invention in a disassembled condition.
Figure 13A:
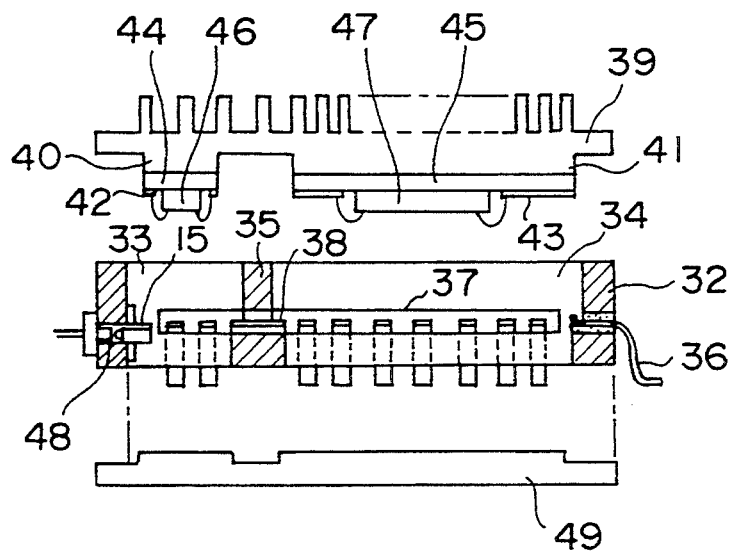
FIG. 13(a) is a sectional view showing an optical fiber-optical device module of a seventh embodiment of the present invention in a disassembled condition.
Figure 13B:
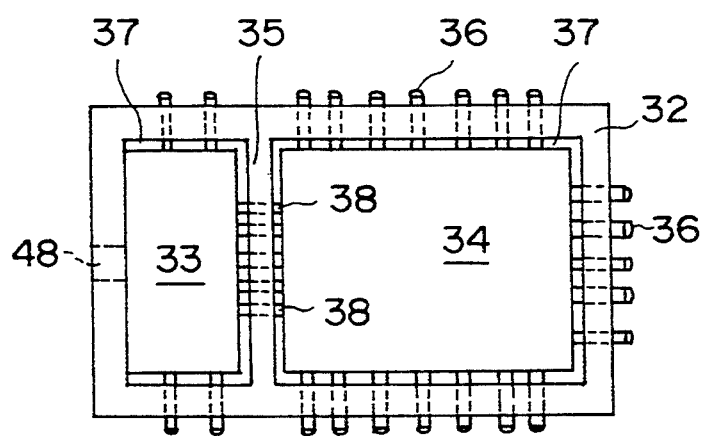
FIG. 13(b) is a plan view showing the module with a heat sink of a package removed.

For example, as shown in FIG. 12, a wiring pattern 29 is formed on a face of a rear lid 28 adjacent the frame 1, and an electronic part 30 is connected to the wiring pattern 29 by flip-chip bonding while exposed faces at the inner ends of the leads 11 are disposed adjacent the rear lid 10. The wiring pattern 29 and the leads 11 are held in contact with each other directly or by way of a pad 31. This eliminates the time required for wire bonding.

Where the electronic part 30 has a large size, the pads 9a of the electronic part 9 and the inner ends of the leads 11 may be held in an opposing relationship to and in direct contact with each other. This structure allows, when some trouble occurs, the heat sink 8 or the lid 10 to be opened to perform repair or exchange the electronic part 30. Seventh Embodiment While, in the first embodiment described above, the electronic part accommodating chamber 2 is provided only by one, the inside of the frame may be partitioned to form two such electronic part accommodating chambers as shown in FIGS. 13(a) and 13(b).

In particular, a conductive frame 32, which is open at the top and the bottom thereof, is partitioned by a partition 35 to define a pair of electronic part accommodating chambers 33 and 34, and an insulating support layer 37 having leads 36 held therein is formed in a portion of each of the electronic part accommodating chambers 33 and 34. Another insulating support layer 37 made of a ceramic material and holding leads 38 therein extends through the partition 35 so that electronic parts 46 and 47 accommodated in the electronic part accommodating chambers 33 and 34, respectively, may be electrically connected to each other.

A pair of projecting portions 40 and 41 are formed on a face of a heat sink 39 adjacent the frame 32 and are fitted in the electronic part accommodating chambers 33 and 34, respectively, and electronic part carrying circuit boards 44 and 45 on which wiring patterns 42 and 43 are formed are adhered to the projecting portions 40 and 41 of the heat sink 39, respectively. Electronic parts 46 and 47 such as LSIs are mounted on the electronic part carrying circuit boards 44 and 45 and terminals of them are connected to the wiring patterns 42 and 43 by wire bonding, respectively. When the heat sink 39 on which the electronic parts 46 and 47 are mounted are mounted at the top of the frame 32, the wiring patterns 42 and 43 of the electronic part carrying circuit boards 44 and 45 contact with the leads 36 and 37, respectively, and the wiring pattern 42 contacts with a stripe pattern 15 of a support base plate 13 for optical devices mounted in an opening 48 in a side wall of the frame 32.

It is to be noted that a portion of the frame 32 remote from the heat sink 39 is closed with a rear lid 49.

With such structure as described above, since the frame 32 and the partition 35 are formed from a conductive material and the frame 32 is partitioned by the partition 35 to define the two electronic part accommodating chambers 33 and 34, when an LSI for microwaves is accommodated as an electronic part in the frame 1, the LSI is held in a shielded condition, and accordingly, it will not have a bad signaling influence upon any other electronic part. Eighth Embodiment While, in the seventh embodiment described above, the two electronic part accommodating chambers 33 and 34 are formed in the frame 32, where the optical devices to be coupled to optical fibers are, for example, photodiodes, one of LSIs 51 and 52 which is to be shielded may be covered with a conductive cap 50 as shown in FIG. 14.

Figure 14:
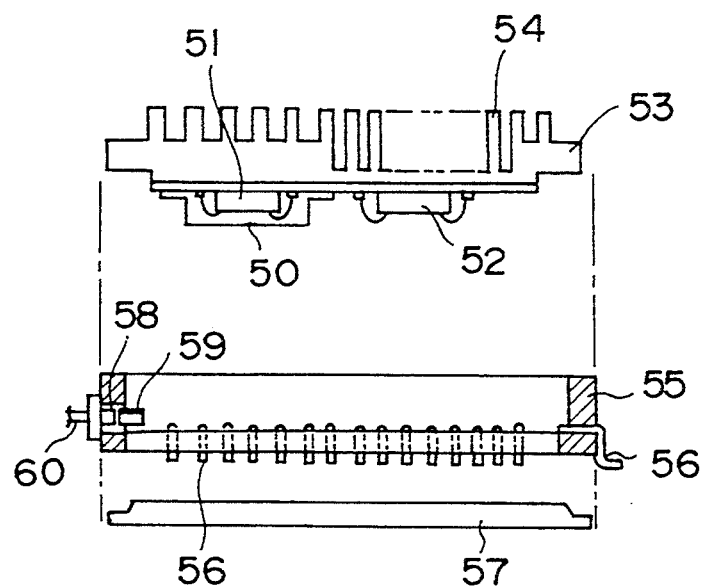
FIG. 14 is a sectional view showing an optical fiber-optical device module of an eighth embodiment of the present invention in a disassembled condition.

By the way, a heat sink 53 shown in FIG. 14 has an increased thermal diffusion effect by increasing the number of fins 54 in a region thereof corresponding to the LSI 52 which generates a great amount of heat or by forming the grooves between the fins 54 deeply. The heat sink 53 can thus make the temperature distribution of the optical transmission coupling apparatus uniform thereby to decrease otherwise possible deformation of the frame 55 arising from a non-uniform thermal expansion distribution.

In FIG. 14, reference number 56 denotes a lead attached in an isolated condition on a side portion of the frame 55, 57 a rear lid mounted below the frame 55, 58 an opening formed in a side wall of the frame, 59 a support base plate on which the photodetectors are mounted, and 60 an optical fiber.

Figure 15:
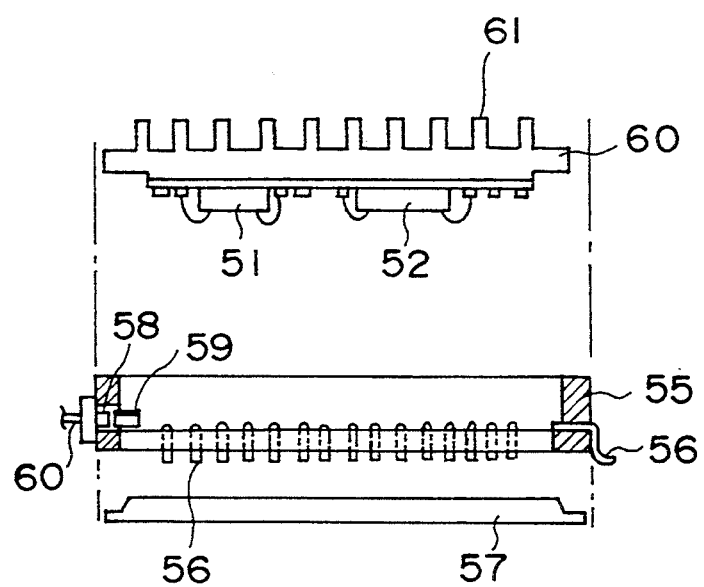
FIG. 15 is a sectional view showing another form of the optical fiber-optical device module of the sixth embodiment of the present invention.
Figure 16A:
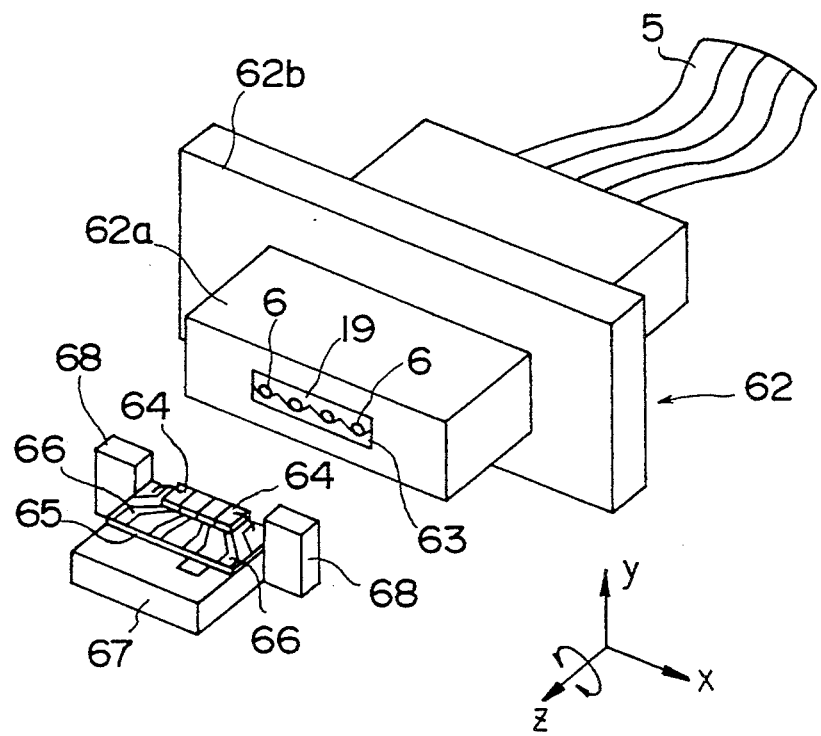
FIG. 16(a) is a perspective view showing construction of an optical fiber and an optical device of the optical fiber-optical device module of FIG. 14.
Figure 16B:
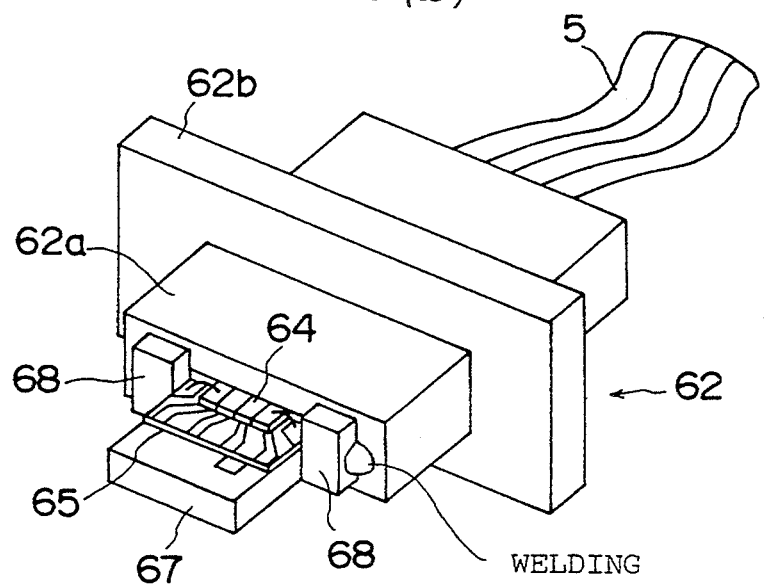
FIG. 16(b) is a perspective view illustrating a connection condition between the optical device and the optical fiber.

By the way, where the optical devices mounted in the opening 58 are semiconductor lasers, it is little necessary to shield an LSI connected to them or to take a heat radiating effect into consideration, and accordingly, as shown in FIG. 15, the LSI 51 is not covered with a cap and besides the distribution of fins 61 of the heat sink 60 is uniform. In this instance, only it is necessary to replace the heat sink with another heat sink of the different structure. Ninth Embodiment While, in the embodiments described above, the optical devices are mounted into the openings, formed in the side wall of the frame of the package, from the electronic part accommodating chamber side while the optical fibers are mounted into the openings from the other or outer side, the optical fibers and the optical devices may otherwise be coupled to each other outside the frame as seen in FIGS. 16(a) and 16(b).

End portions of the optical fibers 6 coated with a metal are exposed from the multi-channel ribbon 5 and secured in an airtight condition in a block 19 made of silicon, and the block 19 is attached to a ferule 62 for the optical fibers 6. The block 19 is inserted in an airtight condition in a hole 63 of the ferule 62.

The optical fibers 6, the block 19 and the ferule 62 are disposed such that end faces of them may be aligned with each other in a plane.

A plurality of semiconductor lasers 64 are carried on an optical device carrier 65 and have optical output ends thereof disposed along an edge at an end of the optical device carrier 65. Electrodes of the semiconductor lasers 64 are connected directly or by way of wires to an electrode pattern 66 formed on an element carrying face of the optical device carrier 65.

The optical device carrier 65 is secured to a metal stem 67, which is positioned such that an edge at an end thereof is aligned with and extends along the optical output ends of the semiconductor lasers 64. A pair of arms 68 are formed adjacent side portions of the metal stem 67 on the opposite sides of the semiconductor layer 65 and extend in a perpendicular direction from the carrying face of the optical device carrier 65, and end faces of the arms 68 adjacent the optical output ends of the semiconductor lasers 65 are formed in an aligned condition with an end face of the metal stem 67.

The arms 68 are fixed to the end face of the ferule 62 at a moment by welding using a YAG laser while the optical output ends of the semiconductor lasers 64 and the end faces of the optical fibers 6 are opposed to each other.

Adjustment in position between the optical output ends of the semiconductor lasers 65 and the end faces of the optical fibers 6 is performed while light emitted from the semiconductor lasers 64 is irradiated upon the optical fibers 6, and is thus performed by movement of the metal stem 67 in the x direction and the y direction on the end face of the ferule 62 and by angular adjustment of the metal stem 67 with respect to the z axis perpendicular to the x and y directions.

Figure 4:
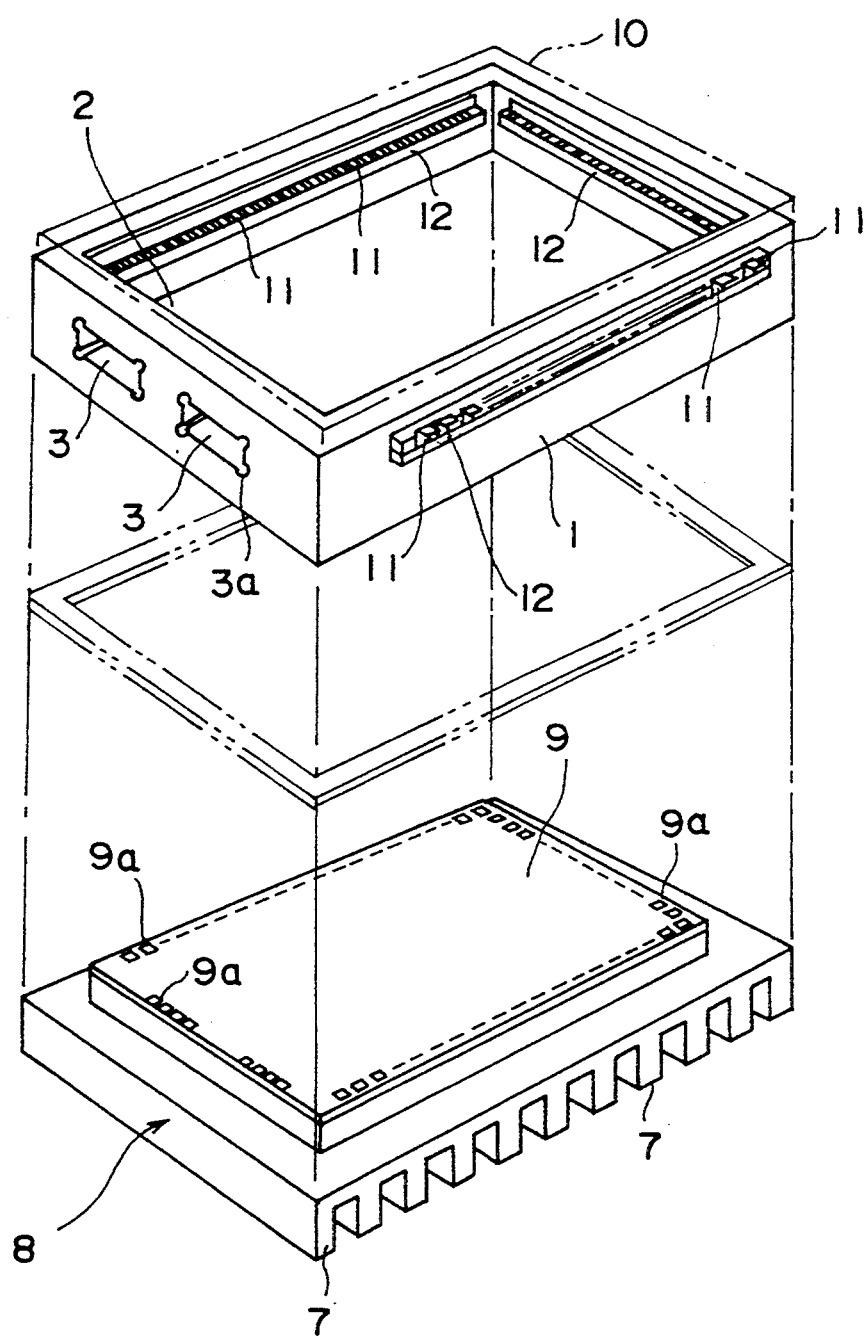
FIG. 4 is an exploded perspective view of the optical fiber-optical device module of FIG. 3 as viewed from the side of a rear lid.

When the ferule 62 for optical fibers is to be mounted onto the frame 1 shown in FIG. 3, such a procedure is adopted that a sleeve 62a of the ferule 62 is accommodated into an opening 3 of the frame 1 until a flange 62b of the ferule 62 is abutted with a side wall of the frame 1, and in this condition, the arms 68 of the metal stem 67 and the end face of the ferule 62 are fixed to each other by YAG laser welding. It is to be noted that optical devices to be carried on the optical device carrier 65 are not limited to semiconductor lasers but may be such photodetectors as in the first embodiment.

Where the optical fibers and the optical devices are coupled to each other outside the package in this manner, it is only required that, in the frame 1 of the package 1 shown in FIG. 4, the semiconductor lasers 64, the electronic parts 9 and the leads 11 be electrically connected to each other and then the heat sink 8 and the rear lid 10 be fitted to the top and the bottom of the frame 1, and accordingly, the yield in assembly is enhanced.

Also in the present embodiment, similarly as in the first embodiment, heat generated from the electronic part 9 mounted in the package is radiated from the heat sink 8 to the outside, and heat generated from the semiconductor lasers 64 is radiated sufficiently from the frame 1 by way of the ferule 62 for optical fibers.

Figure 17:
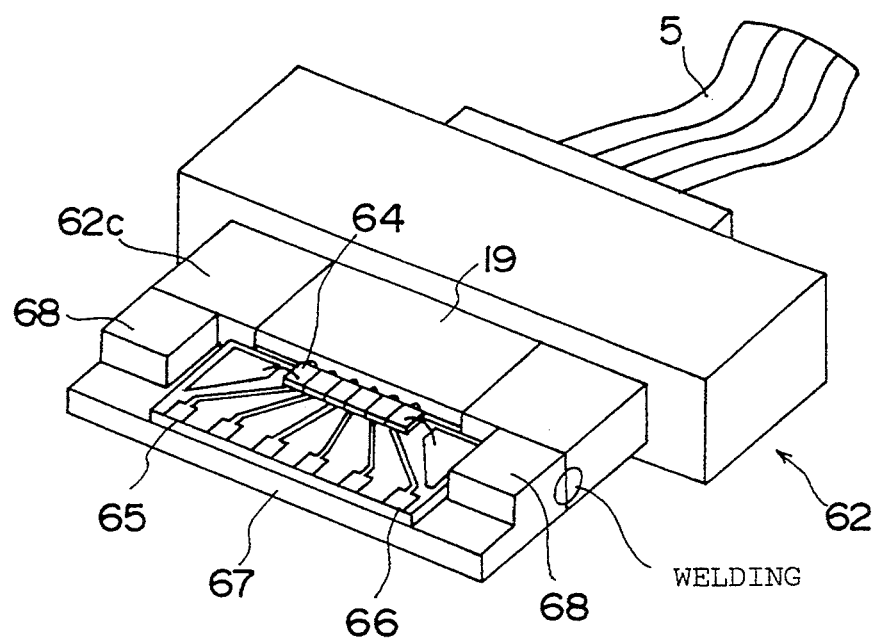
FIG. 17 is a perspective view illustrating a connection condition between an optical device and an optical fiber of another construction of the eighth embodiment of the present invention.

By the way, while the ferule 62 for optical fibers shown in FIGS. 16(a) and 16(b) has such a structure that the hole 63 is formed in the ferule 62 and the block 19 is inserted in the hole 63, alternatively such a structure as shown in FIG. 17 may be employed wherein the sleeve 62c of the ferule 62 is formed substantially in a U-shaped section and the block is carried in the recessed portion of the sleeve 62c.

Further, the distance between the opposite side faces of the arms 68 of the metal stem 67 may be smaller than the width of the sleeve 62a of the ferule 62 as shown in FIG. 16(b) or alternatively be equal to the width of the sleeve 62c as shown in FIG. 17. Where the distance is smaller than the width of the sleeve 62a, welding for securing the metal stem 67 is performed on the end face of the ferule 6, but where the distance is equal to the width of the sleeve 62a, welding is performed on a side portion of the sleeve 62c.

What is claimed is:

1. An optical fiber-optical device coupling package, comprising:
   a frame member open at a top and a bottom thereof for accommodating an electronic part therein;
   said frame member having an opening formed in a portion of a side wall thereof in which an optical fiber and an optical device are coupled to each other;
   first and second lids for closing the top and the bottom of said frame member, respectively;
   a plurality of heat radiating fins formed on said first lid; and
   a heat insulating member disposed between said first lid and said frame member.

2. An optical fiber-optical device coupling package according to claim 1, further comprising lead terminals extending through said side wall of said frame member.

3. An optical fiber-optical device coupling package according to claim 2, wherein said frame member is made of a conductive material, and said lead terminals are electrically isolated from said frame member.

4. An optical fiber-optical device coupling package according to claim 1, further comprising lead terminals extending from said frame member to the outside through said second lid.

5. An optical fiber-optical device module, comprising:
   a frame member open at a top and a bottom thereof for accommodating an electronic part therein;
   said frame member having an opening formed in a side wall thereof;
   an optical device disposed in said opening on an inner side of said frame member;
   an optical fiber disposed in said opening on an outer side of said frame member and optically coupled to said optical device in said opening;
   first and second lids for closing the top and the bottom of said frame member, respectively, said first lid being thermally connected to said electronic part; and
   a plurality of heat radiating fins formed on said first lid.

6. An optical fiber-optical device module according to claim 5, wherein each of said optical fiber and said optical device is disposed by a plural number.

7. An optical fiber-optical device module according to claim 5, further comprising a ferule fitted in said opening and having said optical fiber mounted thereon, said optical device being secured to an end face of said ferule adjacent said opening.

8. An optical fiber-optical device module according to claim 5, further comprising a lead extending through said side wall of said frame member.

9. An optical fiber-optical device module according to claim 8, wherein said lead is connected to an electrode of the electronic part by way of a conductive member, and the electrode of the electronic part is connected to an electrode of said optical device by way of another conductive member.

10. An optical fiber-optical device module according to claim 8, wherein said lead contacts directly with an electrode of the electronic part in said frame member.

11. An optical fiber-optical device module according to claim 5, wherein the electronic part is carried on a face of said first lid while said heat radiating fins are formed on the opposite face of said first lid.

12. An optical fiber-optical device module according to claim 5, wherein the electronic part is carried on a face of said second lid adjacent said frame member and a lead is connected to the opposite face of said second lid, and a face of said first lid adjacent said frame member is thermally connected to the electronic part and said heat radiating fins are formed on the opposite face of said first lid.

13. An optical fiber-optical device module according to claim 5, further comprising a support base plate having said optical device mounted thereon, said support base plate having a wiring pattern in the form of a microstrip line formed on a surface thereof.

14. An optical fiber-optical device module according to claim 5, wherein the electronic part is disposed by a plural number in said frame member.

15. An optical fiber-optical device module according to claim 14, wherein at least one of the electronic parts accommodated in said frame member is covered with a conductive cap.

16. An optical fiber-optical device module according to claim 5, wherein the inside of said frame member is partitioned into a plurality of spaces by a partition, and the electronic part is accommodated in each of said spaces.

17. An optical fiber-optical device module according to claim 16, further comprising a lead extending through said partition.

18. An optical fiber-optical device module according to claim 5, wherein said plurality of heat radiating fins are formed in a non-uniform distribution density on said first lid.

19. An optical fiber-optical device module according to claim 5, wherein said plurality of heat radiating fins are formed on said first lid and have non-uniform surface areas.

20. An optical fiber-optical device according to claim 5, wherein an end portion of said optical fiber adjacent said opening has a face inclined with respect to an optical axis of said optical fiber, and an optical input end or an optical output end of said optical device is disposed around said optical fiber in the proximity of said inclined face of said optical fiber.

21. An optical fiber-optical device module according to claim 5, wherein an end of said optical fiber is attached to a connector fitted in said opening.

22. An optical fiber-optical device coupling package according to claim 1, wherein said first lid has a region for supporting the electronic part in a surface which is opposite to that of said radiating fins.

23. An optical fiber-optical device module according to claim 5, further including a heat insulating member disposed between said first lid and said frame member.

24. An optical fiber-optical device module, comprising:
  a frame member open at a top and a bottom thereof for accommodating an electronic part therein;
  said frame member having an opening formed in a side wall thereof;
  an optical device disposed in said opening on an inner side of said frame member;
  an optical fiber disposed in said opening on an outer side of said frame member and optically coupled to said optical device in said opening;
  first and second lids for closing the top and the bottom of said frame member, respectively; and
  a plurality of heat radiating fins formed in a non-uniform distribution density on said first lid.

25. An optical fiber-optical device module, comprising:
  a frame member open at a top and a bottom thereof for accommodating an electronic part therein;
  said frame member having an opening formed in a side wall thereof;
  an optical device disposed in said opening on an inner side of said frame member;
  an optical fiber disposed in said opening on an outer side of said frame member and optically coupled to said optical device in said opening;
  first and second lids for closing the top and the bottom of said frame member, respectively; and
  a plurality of heat radiating fins formed on said first lid and having non-uniform surface areas.

* * * * *

UNITED STATES PATENT AND TRADEMARK OFFICE
CERTIFICATE OF CORRECTION

PATENT NO.  : 5,436,997
DATED       : July 25, 1995
INVENTOR(S) : Masao MAKIUCHI et al.

It is certified that error appears in the above-indentified patent and that said Letters Patent is hereby corrected as shown below:

Column 8, line 57, insert new paragraph indentation starting with "Seventh Embodiment".

Column 9, line 36, insert paragraph indentation starting with "Eighth Embodiment"; and line 68, insert paragraph indentation starting with "Ninth Embodiment".

Signed and Sealed this

Seventh Day of November, 1995

Attest:

BRUCE LEHMAN

*Attesting Officer*          *Commissioner of Patents and Trademarks*